Figure 1:
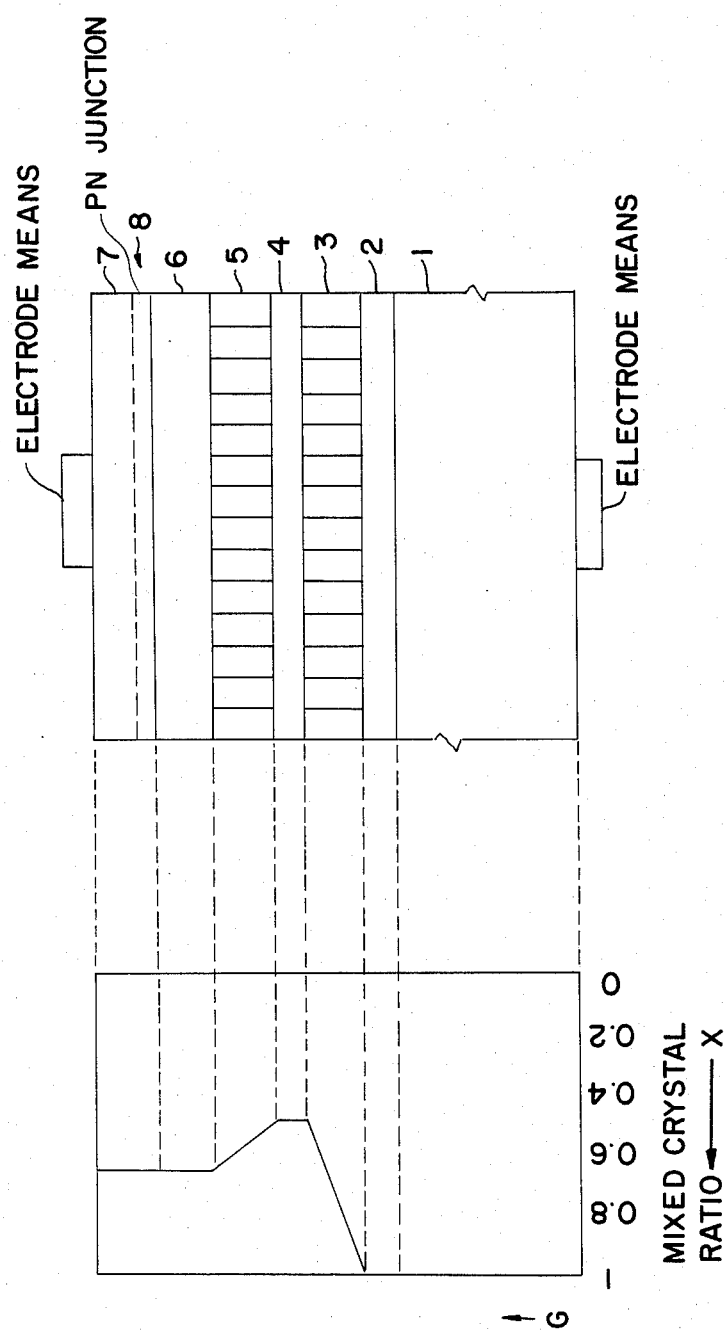

United States Patent [19]

Kajita et al.

[11] Patent Number: 4,510,515
[45] Date of Patent: Apr. 9, 1985

[54] EPITAXIAL WAFER OF COMPOUND SEMICONDUCTOR DISPLAY DEVICE

[75] Inventors: Masaki Kajita, Hatano; Tomio Nakaya, Yokohama; Shinichi Hasegawa; Hisanori Fujita, both of Tsuchiura, all of Japan

[73] Assignees: Stanley Electric Co., Ltd.; Mitsubishi Monsanto Chemical Co., Ltd., both of Tokyo, Japan

[21] Appl. No.: 578,600

[22] Filed: Feb. 10, 1984

Related U.S. Application Data

[63] Continuation of Ser. No. 229,197, Jan. 28, 1981.

[51] Int. Cl.³ ............... H01L 29/161; H01L 29/205; H01L 33/00
[52] U.S. Cl. .................... 357/17; 357/16; 357/61; 372/45
[58] Field of Search ............ 357/16, 17, 61; 372/43, 372/45, 50; 313/498, 500

[56] References Cited

U.S. PATENT DOCUMENTS

| | | | |
|---|---|---|---|
| 3,813,587 | 3/1974 | Umeda et al. | 357/16 X |
| 3,873,382 | 3/1975 | Groves et al. | 357/90 X |
| 4,359,774 | 11/1982 | Olsen et al. | 357/17 |
| 4,378,259 | 3/1983 | Hasegawa et al. | 357/16 X |

FOREIGN PATENT DOCUMENTS

| | | | |
|---|---|---|---|
| 54-125989 | 9/1979 | Japan | 357/17 |
| 54-146984 | 11/1979 | Japan | 357/17 |

OTHER PUBLICATIONS

D. K. Wickenden, "High-Resolution LED Displays for Avionic Applications", *GEC Journal of Science & Technology*, vol. 46, (1980), pp. 91–95.

Primary Examiner—William D. Larkins
Assistant Examiner—J. Carroll
Attorney, Agent, or Firm—Burgess, Ryan & Wayne

[57] ABSTRACT

An epitaxial wafer of a compound semiconductor comprising a single crystalline semiconductor substrate consisting of GaP and an active layer consisting of $GaAs_{1-x}P_x$, having a mixed crystal ratio (x) in the range of from 0.5 to 1 is used for an LED. According to the present invention, between the single crystalline semiconductor substrate and the active layer, a light-absorbing layer consisting of $GaAs_{1-x}P_x$ having the mixed crystal ratio (x) smaller than that of the active layer, is formed to suppress the reflection of light from the surface of the substrate.

2 Claims, 1 Drawing Figure

EPITAXIAL WAFER OF COMPOUND SEMICONDUCTOR DISPLAY DEVICE

This application is a continuation of application Ser. No. 229,197, filed Jan. 28, 1981.

The present invention relates to an epitaxial wafer of a compound semiconductor, suited for the production of a display device which is comprised of a number of light emitting diodes and which shows a figure, a character and the like.

A display device comprised of a number of the light emitting diodes (LEDs), which are arranged in a dotted matrix, for example a $5 \times 7$ matrix, is used for displaying a simple figure, using Japanese syllabry, alphabets and the like. A small sized display device is made of a monolithic compound semiconductor, in many cases. However, when a display device provided with LEDs emitting green, yellow, orange, red and other colors, is made of a GaP single crystalline substrate and an epitaxial layer, $GaAs_{1-x}P_x$, wherein the mixed crystal ratio (x) ranges from 0.5 to 1 ($0.5 \leq x \leq 1$) is used, the result is that both the substrate and the epitaxial layer exhibit high transparency to a visible ray. Accordingly, a part of the light generated in the LEDs is reflected from the back surface of the display device and is then radiated from the top surface of the display device. This causes such disadvantages that the profile of the displayed figure or image blurs or is made indefinite and further cross talk between the LEDs is generated.

It is an object of the present invention to provide an epitaxial wafer of a compound semiconductor, wherein a reflection of light from the back surface of a display device does not cause the same disadvantages that are present in conventional display devices.

In an epitaxial wafer of a compound semiconductor comprising a single cyrstalline semiconductor substrate consisting of GaP and an active layer consisting of $GaAs_{1-x}P_x$, having the mixed crystal ratio (x) in the range of from 0.5 to 1, an improvement according to the present invention comprises forming, between the single crystalline semiconductor substrate and the active layer, a light-absorbing layer consisting of $GaAs_{1-x}P_x$ having the mixed crystal ratio (x) smaller than that of the active layer. Since the mixed crystal ratio of the light-absorbing layer is smaller than that of the active layer, the light is liable to be absorbed in the light-absorbing layer rather than in the active layer. In addition, the light absorbing layer is formed below the active layer, namely at a level lower than the active layer, the light generated in the active layer and then emitted toward the single crystalline semiconductor substrate is absorbed in the light-absorbing layer, so that reflection from the back surface of the single crystalline semiconductor substrate can be advantageously suppressed.

The present invention is hereinafter explained with reference to the single drawing which schematically illustrates the cross sectional view of an epitaxial wafer and the profile of mixed crystal ratio according to an embodiment of the present invention.

Reference numeral 1 indicates a single crystalline semiconductor substrate consisting of GaP which is hereinafter simply referred to as the GaP substrate. The surface of the GaP substrate 1, on which the hereinafter explained epitaxial layers grow, is preferably (100) plane or (100) plane with an off angle of 5° or less, that is an angle deviation of 5° or less from (100) plane to usually a (110) direction.

Desirably, a GaP epitaxial layer 2 having a thickness of from 1 to 10 microns is formed on the GaP substrate 1 as a so called primer. Reference numeral 3 denotes one epitaxial gradient layer of $GaAs_{1-x}P_x$, in which the distribution profile of mixed crystal ratio (x) in the growth direction G is adjusted so that the mixed crystal ratio (x) is continuously decreased from 1 to that of the light-absorbing layer 4. The thickness of the epitaxial gradient layer 3 may be from 10 to 150 microns.

The light-absorbing layer 4 should have the forbidden band gap essentially narrower than that of the active layer, i.e., the mixed crystal ratio x of the light absorbing layer should be less than that of the active layer, so that the light can be satisfactorily absorbed in the light-absorbing layer. A preferably mixed crystal ratio of the light-absorbing layer 4 is not more than 0.6 or less ($0 \leq x \leq 0.6$), when the active layer 8 consists of nitrogen-doped GaP epitaxial crystal used for a green LED. When the active layer consists of $GaAs_{1-x}P_x$ ($0.5 \leq x \leq 1$) epitaxial crystal, such crystal is highly transparent to a visible ray and the LED emits yellow or orange, and hence the electroluminescence wave length is relatively longer than that of the green LED. In such an LED having an active layer 8 consisting of $GaAs_{1-x}P_x$, the mixed crystal ratio (x) of the light-absorbing layer 4 is preferably not more than 0.5 ($0 \leq x \leq 0.5$).

Reference numeral 5 denotes the other epitaxial gradient layer of $GaAs_{1-x}P_x$, in which the distribution profile of mixed crystal ratio (x) in the growth direction G is adjusted so that the mixed crystal ratio (x) is continuously increased from that of the light-absorbing layer 4 to that of the active layer 8.

Reference numeral 8 collectively denotes an active layer consisting of $GaAs_{1-x}P_x$, which has a mixed crystal ratio so that a predetermined electroluminescence wave length can be obtained. The active layer 8 comprises a non doped $CaAs_{1-x}P_x$ layer 6 and a nitrogen doped $GaAs_{1-x}P_x$ layer 7, when the mixed crystal ratio (x) is more than 0.5. When the mixed crystal ratio of $GaAs_{1-x}P_x$ of the active layer 8 is greater than 0.5, the electroluminescence of $GaAs_{1-x}P_x$ is of an indirect transition type and the possibility of light-emitting transition is low. Therefore, nitrogen is doped into the $GaAs_{1-x}P_x$ crystal, so as to enhance the emission efficiency of LED. A PN junction is formed in the nitrogen doped $GaAs_{1-x}P_x$ layer 7 which is formed by doping nitrogen into an epitaxial $GaAs_{1-x}P_x$ crystal. In the epitaxial wafer, the mixed crystal ratio is continuous at the boundary between the layers (1 through 7) as seen in the growth direction.

Usually, the GaP substrate 1 and epitaxial layers have an N conductivity type and contain as dopants Si, S, Te and the like. Therefore, in order to form an LED using the epitaxial wafer as illustrated in FIG. 1, P type impurities, such as Zn, are diffused or ion-implanted into the epitaxial wafer. In addition, the isolation between the LEDs formed in the epitaxial wafer can be realized by, for example, selectively introducing impurities in the epitaxial wafer, so that display devices comprising seven segments or $5 \times 7$ dotted matrix can be produced.

The present invention is explained hereinafter by way of an example.

EXAMPLE

The single crystalline GaP substrate exhibited N type conductivity as a result of doping of sulfur, and had an N type-carrier concentration of $3 \times 10^{17}/cm^3$, a thickness of 280 μm and a surface orientation of 5° deviation from (100) to (110) direction. The single crystalline GaP substrate was mirror-finished and then cleaned and located in a horizontal epitaxial-reaction chamber comprising a quartz boat with an inner diameter of 70 mm and a length of 100 cm. Argon gas was introduced into the horizontal epitaxial-reaction chamber so as to replace the air in the chamber with the argon gas. The introduction of argon gas was interrupted when the air was thoroughly removed from the horizontal epitaxial-reaction chamber, and, then a high purity argon as carrier gas was introduced into the horizontal epitaxial-reaction chamber at a rate of 2000 ml/minute. While the carrier gas was being introduced, the temperature elevation in the quartz boat, in which a high purity gallium was disposed, was initiated. The gallium and the single crystalline GaP substrate were heated to 750° C. and 910° C., respectively. After making sure that the gallium and single crystalline GaP substrate were constantly held at these temperatures, (1) a nitrogen ($N_2$) gas containing 20 ppm of $H_2S$ at a rate of 20 ml/minute, (2) an HCl gas for transporting gallium at a rate of 30 ml/minute, and (3) a hydrogen ($H_2$) gas containing 12% of $PH_3$ at a rate of 200 ml/minute were introduced into the quartz chamber in a direction from the gallium to the single crystalline GaP substrate. The growth of GaP epitaxial layer 2 (FIG. 1) was carried out over a time period of 15 minutes, while introducing the gases (1), (2) and (3) mentioned above.

Subsequently, the flow rate of hydrogen gas (3) containing $PH_3$ was reduced from 200 ml/minute to 100 ml/minute for a period of 30 minutes, while maintaining the flow rates of the nitrogen gas (1) containing $H_2S$ and the HCl gas (2) constant. Simultaneously with the flow rate reduction of the hydrogen gas containing $PH_3$, the flow of hydrogen gas (4) containing 12% $AsH_3$ was initiated and its flow rate was increased from 0 to 100 ml/minute, thereby forming the epitaxial gradient layer 3 consisting of $GaAs_{1-x}P_x$, in which the mixed crystal ratio (x) was continuously changed from 1 to 0.55 in the growth direction.

Subsequently, (1) the nitrogen gas containing 20 ppm of $H_2S$ at a rate of 20 ml/minute, (2) the HCl gas at a rate of 30 ml/minute, (3) the $H_2$ gas containing 12% of $PH_3$ at a rate of 100 ml/minute, and (4) the HCl gas containing 12% of $AsH_3$ at a rate of 100 ml/minute, the gaseous composition composed of these gases being obtained at the end of the growth of the epitaxial gradient layer 3, were kept flowing for 15 minutes, so as to form a light-absorbing layer 4. After the completion of the growth of the light-absorbing layer 4, the flow rate of the hydrogen gas containing $AsH_3$ was reduced from 100 ml/minute to 0(zero). For the reduction of the flow rate 30 minutes were necessary. Simultaneously with the reduction of the flow rate of the hydrogen gas containing $AsH_3$, the flow rate of the hydrogen gas containing $PH_3$ was increased from 100 ml/minute to 200 ml/minute, so as to form the epitaxial gradient layer 5, in which the mixed crystal ratio was continuously changed from 0.55 to 1 in the growth direction. For the increase of the flow rate 30 minutes were necessary.

After the growth of the epitaxial gradient layer 5, the active layer 8 consisting of GaP was epitaxially grown for 30 minutes. Then, a high purity ammonia ($NH_3$) was introduced into the quartz boat over the period of 30 minutes at a rate of 200 ml/minute, so as to dope nitrogen into the active layer 8 and thus to epitaxially form the nitrogen doped GaP layer 7. The production of the epitaxial wafer of GaP with the light-absorbing layer was thus completed.

A display device provided with 5×7 dotted matrix, which was produced using the epitaxial wafer mentioned above, exhibited cross talk of one fifth of the conventional display device.

We claim:

1. In an epitaxial GaP wafer green light-emitting display device, comprising (a) a single crystalline semiconductor substrate consisting of GaP, (b) an active layer of N-doped GaP having a PN junction therein, (c) a GaP epitaxial layer formed on said single crystalline semiconductor substrate, and (d) electrode means coupled to said active layer for applying a voltage across said P-N junction, the improvement comprising a light-absorbing layer disposed between the GaP epitaxial layer and the active layer, said light-absorbing layer consisting of $GaAs_{1-x}P_x$ having a mixed crystal ratio (x) of 0.6 or less, a first graded epitaxial layer consisting of $GaAs_{1-x}P_x$ and formed between said light absorbing layer and said active layer, the mixed crystal ratio (x) of said $GaAs_{1-x}P_x$ first graded epitaxial layer continuously increasing in a growth direction extending from said substrate to said active layer, and a second graded epitaxial layer consisting of $GaAs_{1-x}P_x$ and formed between said light-absorbing layer and said GaP epitaxial layer, the mixed crystal ratio (x) of said second graded $GaAs_{1-x}P_x$ epitaxial layer continuously decreasing in said growth direction.

2. An epitaxial GaAsP/GaP wafer yellow or orange light-emitting display device, comprising a single crystalline semiconductor substrate consisting of GaP, an active layer of nitrogen doped $GaAs_{1-x}P_x$ having a PN junction therein, said active layer having a mixed crystal ratio (x) in the range from 0.5 to 1, a GaP epitaxial layer formed on said single crystalline semiconductor substrate, electrode means coupled to said active layer for applying a voltage across said PN junction, a light-absorbing layer disposed between the GaP epitaxial layer and the active layer, said light-absorbing layer consisting of $GaAs_{1-x}P_x$ having a mixed crystal ratio (x) smaller than that of the active layer and not more than 0.5, a first graded epitaxial layer consisting of $GaAs_{1-x}P_x$ and formed between said light-absorbing layer and said active layer, the mixed crystal ratio (x) of said $GaAs_{1-x}P_x$ first graded epitaxial layer continuously increasing in a growth direction extending from said substrate to said active layer, and a second graded epitaxial layer consisting of $GaAs_{1-x}P_x$ and formed between said light-absorbing layer and said GaP epitaxial layer, the mixed crystal ratio (x) of said second graded $GaAS_{1-x}P_x$ epitaxial layer continuously decreasing in said growth direction.

* * * * *